United States Patent [19]
Taylor

[11] Patent Number: 6,164,636
[45] Date of Patent: Dec. 26, 2000

[54] PRINTED CIRCUIT BOARD FIXTURE

[75] Inventor: Livingston Taylor, Hillsboro, Oreg.

[73] Assignee: S.P. Precision International, Ltd., Hillsboro, Oreg.

[21] Appl. No.: 09/256,466

[22] Filed: Feb. 23, 1999

[51] Int. Cl.$^7$ ................................................... B23Q 3/00
[52] U.S. Cl. ........................................ 269/287; 269/903
[58] Field of Search .................................. 269/287, 903; 29/559, 281.1, 760

[56] References Cited

U.S. PATENT DOCUMENTS

| | | |
|---|---|---|
| 3,395,439 | 8/1968 | Palesi et al. . |
| 3,568,263 | 3/1971 | Meehan . |
| 4,007,479 | 2/1977 | Kowalski ................................. 357/70 |
| 4,552,345 | 11/1985 | Benda et al. . |
| 4,588,177 | 5/1986 | White . |
| 4,678,169 | 7/1987 | Fishman et al. . |
| 4,759,488 | 7/1988 | Robinson et al. . |
| 5,044,615 | 9/1991 | Newman et al. . |
| 5,465,470 | 11/1995 | Vongfuangfoo et al. . |
| 5,501,436 | 3/1996 | Miller . |
| 5,785,307 | 7/1998 | Chung . |

*Primary Examiner*—Derris H Banks
*Assistant Examiner*—Daniel Shanley
*Attorney, Agent, or Firm*—Klarquist Sparkman Campbell Leigh & Whinston, LLP

[57] ABSTRACT

A fixture supports and secures a printed circuit board ("PCB") during processing thereof. The fixture includes a frame for supporting the PCB and an attachable and entirely detachable bar or plate for securing the PCB in the fixture. A first opening is defined by the frame and is of sufficient dimensions to expose a first surface of the PCB. The plate defines a second opening, the second opening being of sufficient dimensions to expose a second surface of the PCB for processing. Spring-loaded latch assemblies connect the bar or plate to the frame at its ends or corners, respectively. The latch assemblies are simultaneously actuated by application of a slight pressure on the plate or bar. Simultaneous actuation of the latch assemblies ensures uniform application of pressure on the PCB, to avoid creation of a moment in the board. The latch assemblies do not require an operator's individual, repeated manipulation, but are actuated with a single application of slight pressure to the plate or bar.

20 Claims, 8 Drawing Sheets

PRINTED CIRCUIT BOARD FIXTURE

FIELD OF THE INVENTION

This invention pertains to fixtures for supporting and securing printed circuit boards during various process steps, such as screening and wave soldering.

BACKGROUND OF THE INVENTION

The processing of printed circuit boards (PCB or board) may include a variety of steps, such as screening, placement, solder reflow, auto-insertion, wave soldering, press fitting, conformal coating, etc. Screening is the process of accurately applying solder paste to the areas of the PCB that will be receiving components. Screening is typically the first step in a surface mount process. Placement is the second step in the surface mount process. During the placement step, surface mount components are mechanically placed onto the pre-screened areas of the PCB. The final step of a surface mount process is ordinarily solder reflow, wherein the PCB temperature is elevated to a level sufficient to liquefy the solder paste applied during screening (typically at temperatures of about 300° C. or higher). Reflow of the solder forms the electrical communication or bonds between the surface mount components and the PCB.

During auto-insertion processing of the PCB, through-hole components are mechanically inserted into the PCB. The wave soldering process forms the electrical communication or bonds between through-hole components and the PCB. During wave soldering, the top and bottom surfaces of the PCB are exposed to relatively high temperatures (typically at temperatures greater than about 300° C.). The PCB travels over a molten bath of solder as the PCB is heated from both the top and bottom. The heat causes the molten solder to wick into the through-holes, forming the electric bond between the through-hole components and the PCB.

Press fit or compliant pin processing involves alignment of connector leads with barrels in the PCB, as force is applied to the board to fully seat the component. Press fitting establishes and/or ensures that there is an electrical connection between the PCB and the component. A conformal coating is then applied to the PCB Application of a conformal coating to the PCB protects the board from future, "severe" environments.

Each of the above processes may be more precisely performed utilizing a fixture to support and secure the PCB during the process. The prior art has attempted to accommodate such needs. For example, U.S. Pat. No. 3,395,439 to Palesi discloses an apparatus for securing a PCB for attachment of components thereto. The Palesi apparatus includes a frame with a pair of opposing side members spaced apart by end rods. A groove within each side member receives an edge of the PCB to hold the board during a dip soldering process. Securing of the board in the frame is accomplished by placement of a solid top plate attached to the frame at four corners, by thumbscrews. Because the top of the Palesi fixture is a solid plate, the top surface of the PCB is not accessible for performing PCB processing steps other than dip soldering. Further, the solid top plate acts as a heat sink, disturbing processes requiring that the heat be evenly distributed to the PCB, such as during the wave soldering process.

Additionally, the electronics industry is requiring thinner and thinner PCBs. Accordingly, uniform application of pressure to the PCB secured in a fixture for processing is critical to ensure precise and accurate PCB processing during processes such as wave soldering. Separate manipulation of connectors, such as the thumbscrews of the Palesi device, result in non-uniform pressure on the board causing creation of a moment in the board.

Existing fixtures are devices such as Palesi, wherein the devices have a bottom and a top piece. The top piece requires an operator to manipulate multiple connections at multiple locations to secure the PCB in the fixture. Such fixtures result in uneven pressure being applied to the PCB, creating undesirable moments in the boards that result in inaccurate processing of the boards. Non-concurrent manipulation of multiple fixture connectors on the fixture results in the creation of such moments in the PCB. Specifically, during such manipulation of the first connector, one portion of the board has pressure exerted thereon by the connector while other parts of the board experience little or no pressure. This creates an undesirable moment in the board. In addition to requiring individual operation, the fixture connectors of the prior art devices are such that, even if the connectors were to be simultaneously operable, equal pressure is not applied to the board due to the unequal pressure applied by each of the connectors.

Alternative prior art fixtures are devices having a frame and over arm bar, wherein the over arm bar is permanently attached to one side of the frame. The prior art over arm bars pivot about the permanently attached end. Such pivot action creates undesirable pressure on the boards. That is, the pivoting bar first contacts the PCB upper surface at an angle, exerting pressure on the board at an angle. The angular pressure produces an undesirable moment in the board. Although some prior art over-arm bar fixtures have attempted to reduce the moment created in the PCB by adding a cam-type mechanism to the pivoting bar, unacceptable moments are still created, especially in the thinner PCBs.

Concern regarding operator health has also brought about recent expectations or requirements for such PCB fixtures. Repetitive operator movement is to be limited and should be "ergonomically correct" motions. Prior art PCB fixtures require excessive, often ergonomically incorrect, operator manipulation to open and close the fixtures.

Additionally, many PCB processes require access to both the top and bottom surfaces of a PCB at the same time. Prior art PCB fixtures do not allow simultaneous access to both surfaces of the PCB or severally limit exposure of one or both surfaces of the board. Moreover, because both sides of the PCB may be heated during a particular process, such as wave soldering, the fixture cannot act as an excessive heat sink. That is, for particular PCB processes, it is necessary that both sides of the PCB be exposed to essentially the same temperature, to effect process steps such as solder wicking.

Accordingly, there is a need for PCB fixtures that (1) do not apply non-uniform pressure to the board resulting in creation of a moment in the board, (2) allow exposure of both top and bottom PCB surfaces during processing, (3) require minimal operator movement and minimize or eliminate need for ergonomically incorrect, repetitive operator motion, (4) do not act as undesirable heat sinks, and/or (5) provides one or more hold down devices for securing or placing components on a PCB.

SUMMARY OF THE INVENTION

In light of the deficiencies in the prior art, the present invention provides a printed circuit board fixture for supporting and securing the PCB (and its componentry) during processing thereof. The fixture of the present invention includes a frame for supporting the PCB and a mating, entirely detachable plate for securing the PCB in the fixture. Spring-loaded latch assemblies connect the plate to the frame at its corners, respectively. The latch assemblies may be simultaneously actuated by application of a slight pressure on the plate. Simultaneous actuation of the latch assemblies ensures uniform application of pressure on the PCB such that a moment is not created in the board. Further, the latch assemblies do not require an operator's individual, repeated manipulation, but are actuated with a single application of slight pressure to the plate. Alternatively, the fixture of the present invention may include an over arm bar rather than a plate. The over arm bar includes latch assemblies at each end of the bar so that the bar is completely detachable from the frame.

More specifically, a first aspect of a fixture for supporting and securing a PCB during processing, includes a frame for supporting the PCB. A first opening is defined by the frame and is of sufficient dimensions to expose a first surface of the PCB. The fixture further includes a plate that is attachable to and completely detachable from the frame, wherein the plate applies uniform pressure to the PCB when the plate is attached to the frame. That is, upon attachment of the plate to the frame, a moment is not created in the board. The fixture further includes a second opening defined by the plate; the second opening is also of sufficient dimensions to expose a second surface of the PCB for processing.

The fixture also preferably includes a latch assembly at each corner of the fixture. The latch assemblies are simultaneously actuated by application of pressure on the plate, the latch assemblies thereby attaching the plate to the frame. The simultaneous actuation of the latch assemblies ensures that a moment is not created in the board when the board is secured in the fixture.

In a second aspect, a similar fixture has a removable insert attachable to the plate. The removable insert includes custom openings that allow access to the second surface of the PCB when the PCB is secured in the fixture. The removable insert allows the location and dimensions of the openings to be changed without having to provide an entirely new fixture. That is, a substitute insert may be used with the same plate and frame, thereby reducing production costs whenever the PCB and/or PCB process is changed, requiring openings of different dimensions or hold downs in different locations.

Hold downs are attached to a bottom surface of the insert. The hold downs may perform a variety of functions. For example, a hold down may contact the PCB surface or a component mounted on the PCB, plug a plated through hole or other aperture in the PCB, secure heat sinks at selected locations on the board for specific process steps, and/or may cover one or more portions of the PCB surface (i.e., the hold down may function as a "mask").

The foregoing and other objects, features, and advantages of the present invention will become more apparent from the following detailed description of the fixture embodiments that proceed with reference to the accompanying drawings.

DETAILED DESCRIPTION OF THE INVENTION

Figure 1:
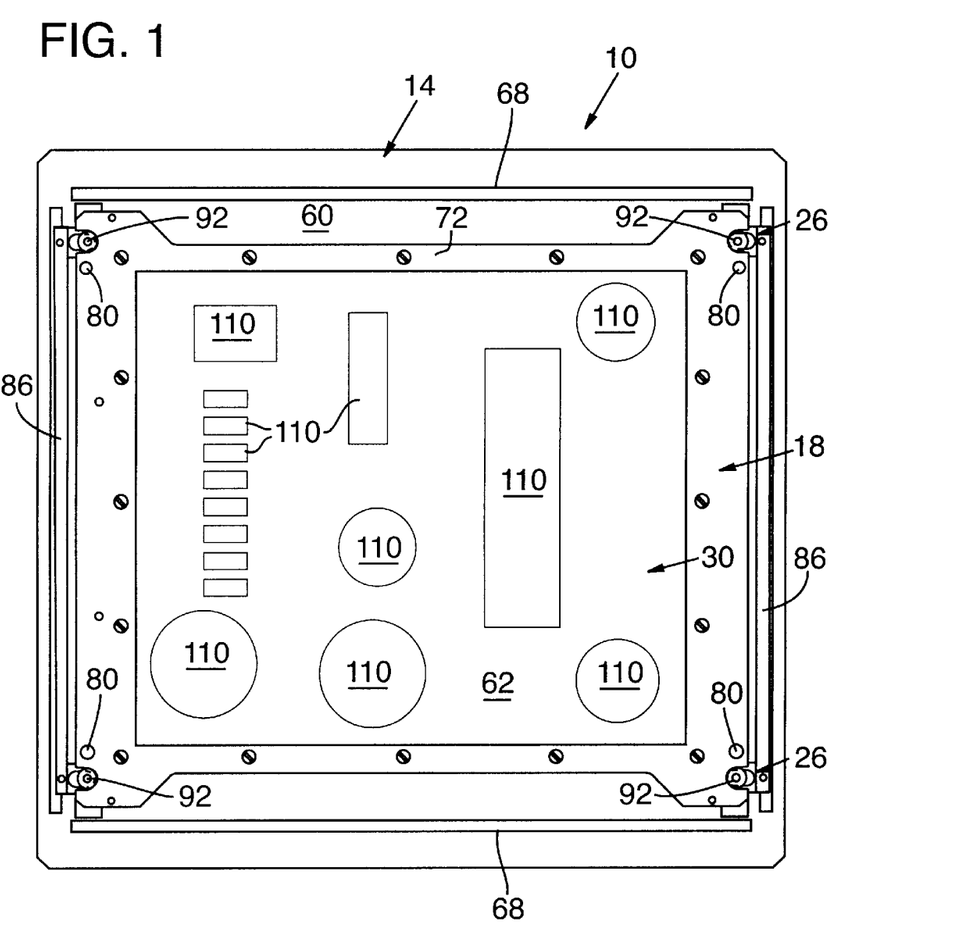
FIG. 1 is a plan view of a first fixture.
Figure 8:
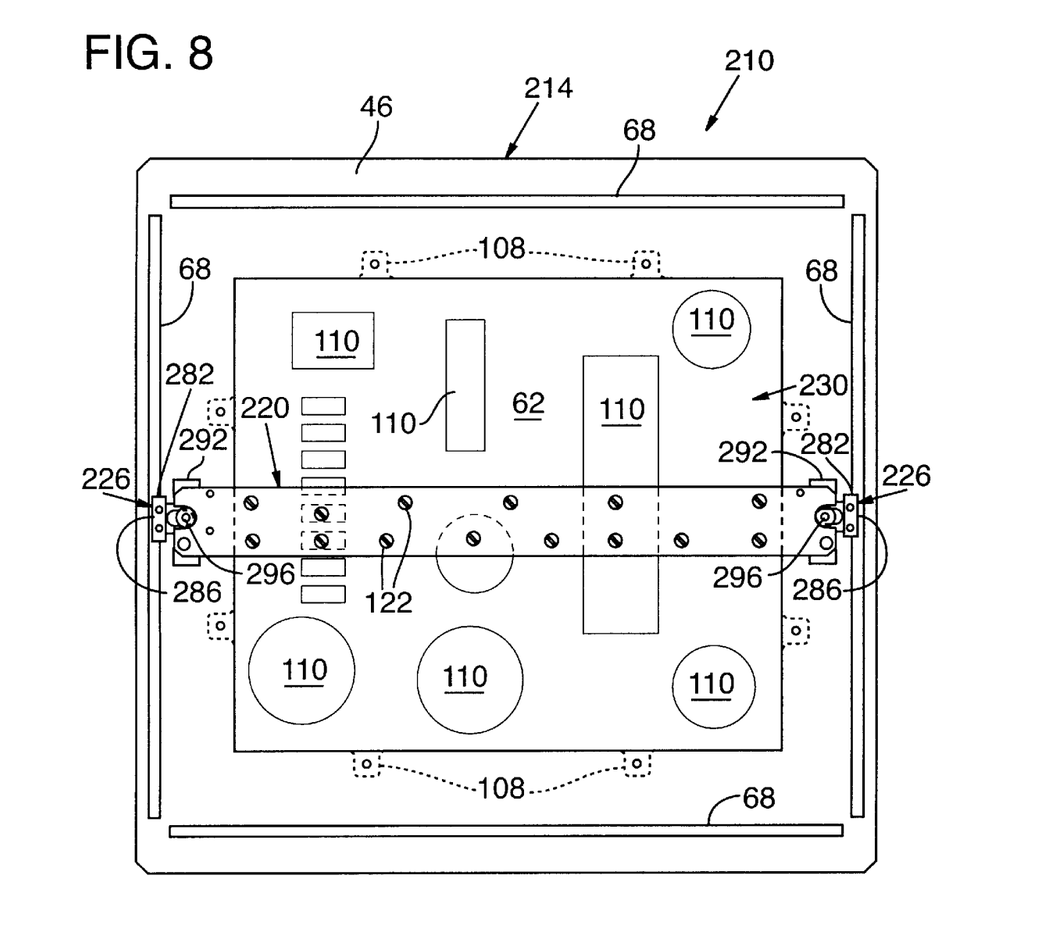
FIG. 8 is a plan view of a third fixture.

Referring to FIG. 1, a printed circuit board fixture 10 is provided for supporting and securing a printed circuit board 30 ("PCB" or "board") during processing thereof. In general, the fixture 10 preferably includes a frame 14 with an entirely detachable plate 18. Alternatively, an over arm bar 220 may be used rather than a plate (FIG. 8). Latch assemblies 26, such as spring-loaded clips, connect the plate 18 to the frame 14 at the plate corners 38a–38d. In the fixture having an over arm bar 220, the latch assemblies 226 are located at each of the bar ends. The latch assemblies 26 preferably comprise connectors that may be simultaneously actuated so that uniform application of force to the PCB is ensured (i.e., there is no creation of a moment in the board).

Although the description herein focuses on supporting and securing printed circuit boards, it is understood that the fixture of the present invention may be used to support and secure a variety of substrates, including a variety of semiconductor industry substrates. Further, although the description herein primarily focuses on use of the fixture of the present invention for supporting and securing PCBs during wave soldering processing, it is understood that the fixture may be used in a variety of PCB processes.

Figure 3A:
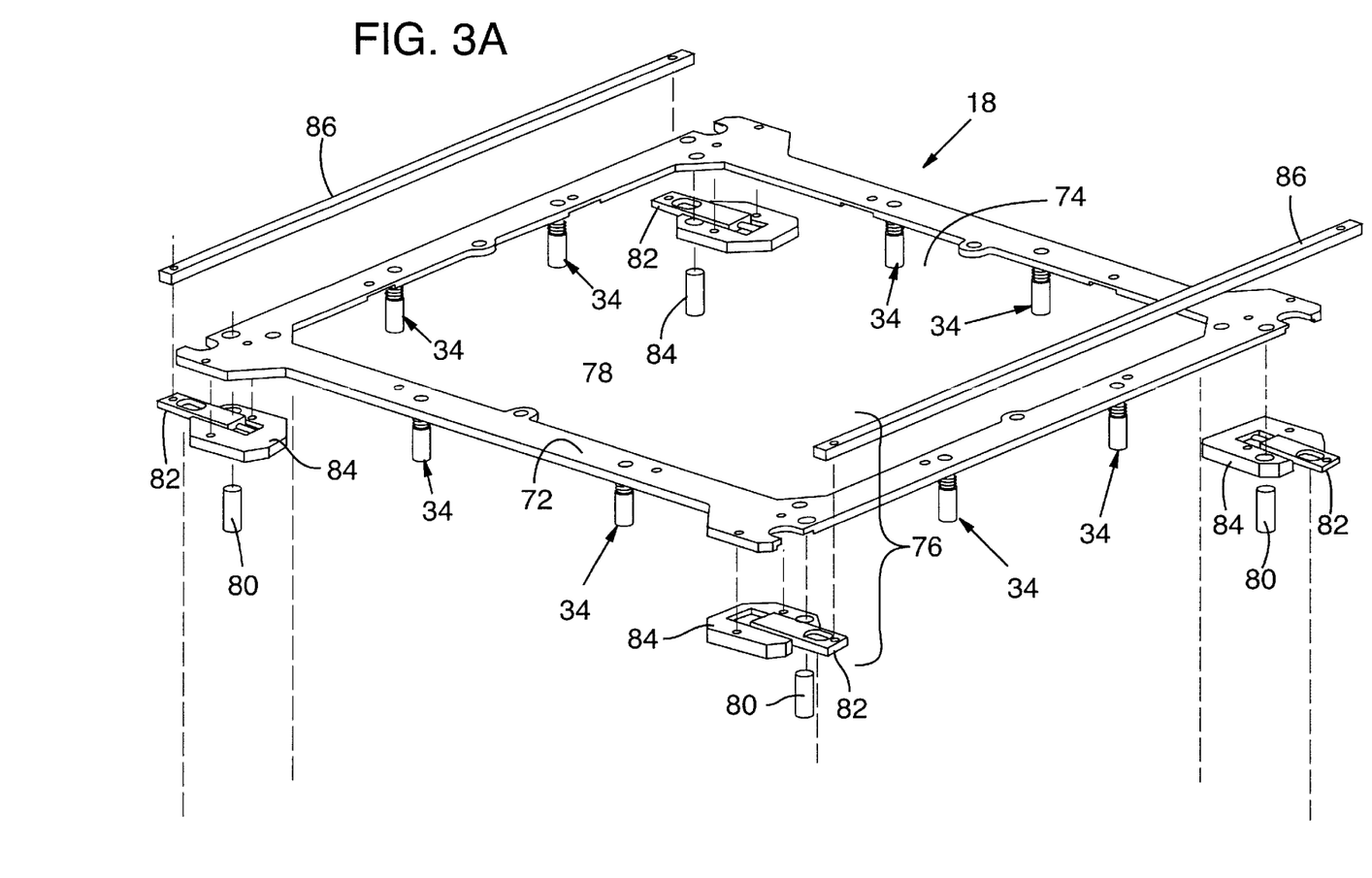
FIG. 3A is an exploded view of the plate of the fixture shown in FIG. 1.
Figure 3B:
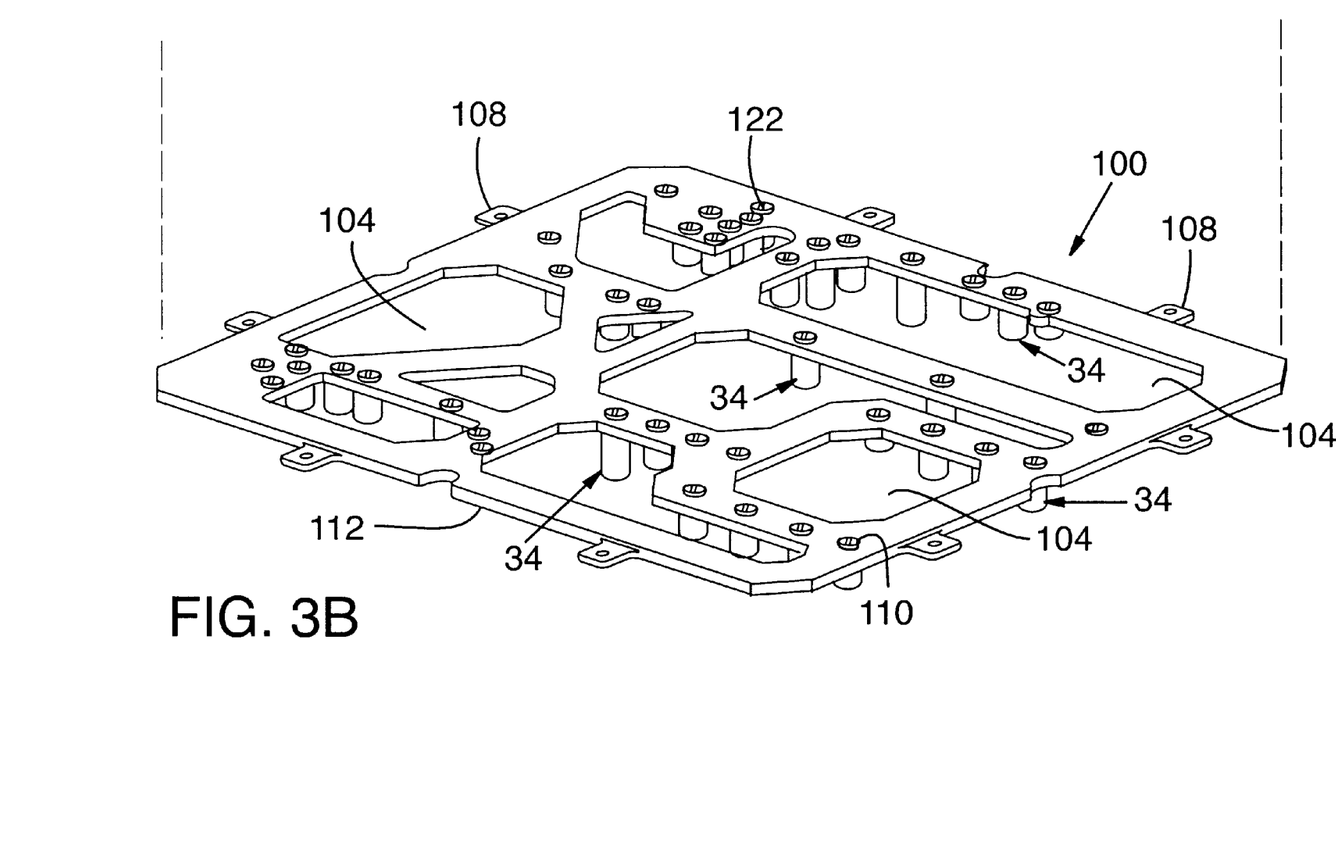
FIG. 3B is an oblique view of an insert for use with the fixture shown in FIG. 2.
Figure 3C:
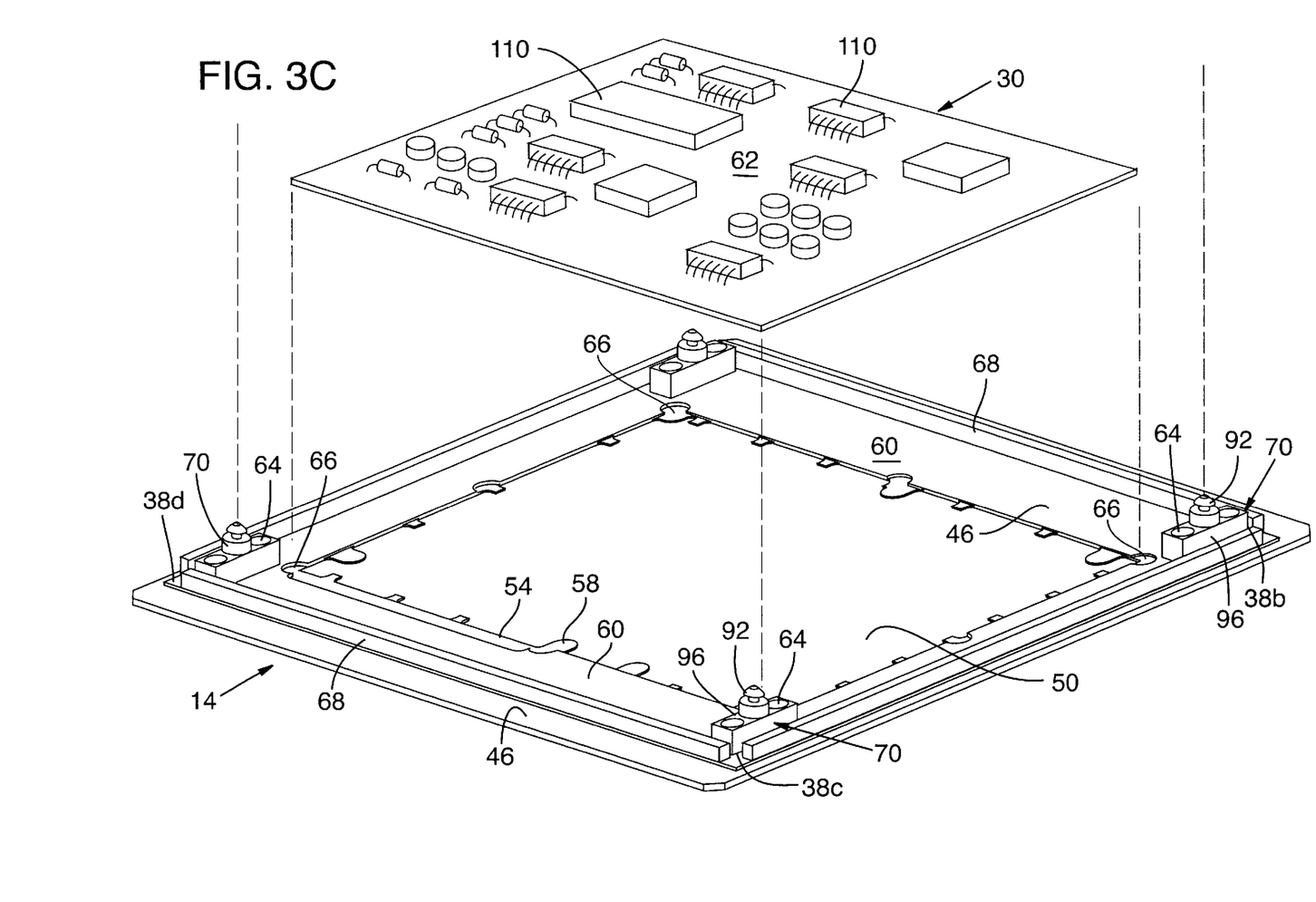
FIG. 3C is an oblique view of a frame of the fixtures shown in FIGS. 1, 2, and 8.

Referring to FIGS. 1, 3A, and 3C, a fixture 10 includes a frame 14, a detachable plate 18, hold downs 34 and a latch assembly 26. As best shown in FIG. 3C, the frame 14 includes a rigid sheet 46 defining a frame opening 50. The sheet 46 and frame opening 50 are of shapes and dimensions sufficient to accommodate a printed circuit board 30. The opening 50 allows exposure of a lower surface of the PCB 30 when the PCB is secured in the fixture 10. Frame opening 50 may take a variety of shapes and dimensions depending upon the fixture user's particular PCB and PCB processes. For example, frame opening 50 may selectively expose or cover portions of the lower surface of the PCB to, e.g., protect particular PCB surface areas or components mounted thereon. Frame opening 50 is preferably about 0.030 inches (0.08 cms) larger in width and length than the PCB to accommodate for possible thermal expansion of the PCB 30 during processing.

The PCB 30 may be placed directly on the frame 14, with or without being directly connected to the frame. Alternatively, the frame 14 further includes a support shelf 54 (FIG. 3C). The support shelf 54 is connected to or is formed by sheet 46 along the frame aperture 50 to support the PCB 30 at its outermost edges. Additionally or alternatively, support tabs 58 may be connected to or formed by sheet 46 to support the PCB 30.

Support tabs 50 may be of a variety of shapes depending upon the particular PCB process. Placement and dimensions of the support shelf 54 and/or the support tabs 58 are dependent upon the particular PCB to be processed.

Typically, a minimal portion of the PCB 30 is covered by the support shelf 54 or tabs 58, while being large enough in dimension to ensure sufficient PCB support to prevent sagging. Preferably, but not necessarily, the support shelf 54 (or support tabs 58) is formed along each side of the frame opening 50. The upper surface 62 of the PCB 30, when placed on the support shelf 54 (or support tabs 58) in the frame 14, may be even with the upper surface 60 of the sheet 46 (i.e., the support shelf 54 is of a depth substantially equal to the thickness of the PCB to be processed). Alternatively, the PCB upper surface may be either higher or lower than the upper surface 60 of the sheet 46.

The frame 14 further includes a support wall 68 to add strength to the frame. Support wall 68 may also function as a solder dam during the wave soldering process to avoid the flow of molten solder over the upper surface 60 of the PCB 30. Guide holes 64 are defined in the frame 14 to receive guide posts 80 (FIGS. 3A and 4) of the plate 18, as discussed below. A guide hole 64 is preferably defined in the frame 14 at each of the corners thereof. In the embodiment shown in FIG. 3C, the guide hoses 64 are defined in lower portions 70 of the latch assemblies 26. Lower portions 70 of the latch assemblies 26 are preferably located on each corner of the frame 14 for connection to the detachable plate 18. The latch assemblies 26 are discussed in more detail below. The frame 14 may also include access holes 66 to aid in the removal of a PCB 30 from the frame (FIG. 3C).

The sheet 46 and the support shelf 54 (or support tabs 58) of frame 14 is made of a material that is sufficiently rigid to support the PCB 30 and plate 18. Preferably, the sheet 46 and support shelf 54 material has characteristics sufficient to withstand temperatures in excess of 300° C. Composite material that is resistant to the chemicals typically used for the processing of PCBs, including resistance to lead adhesion has been found to be particularly useful. Additionally, composite material is preferably relatively light in weight and is resistant to heat deterioration and wear. The composite material may comprise an electrostatic dissipative (ESD) or non-ESD material. The composite material may be, for example, a thermoset epoxy-based resin having a carbon load. Such a material is available from Von Roll Isola of France. The support wall 68 of the frame 18 and the lower portion 70 of the latch assembly 26 may be made of a variety of substantially rigid materials, such as stainless steel, titanium, aluminum, a high-temperature thermoplastic resin, etc.

Figure 4:
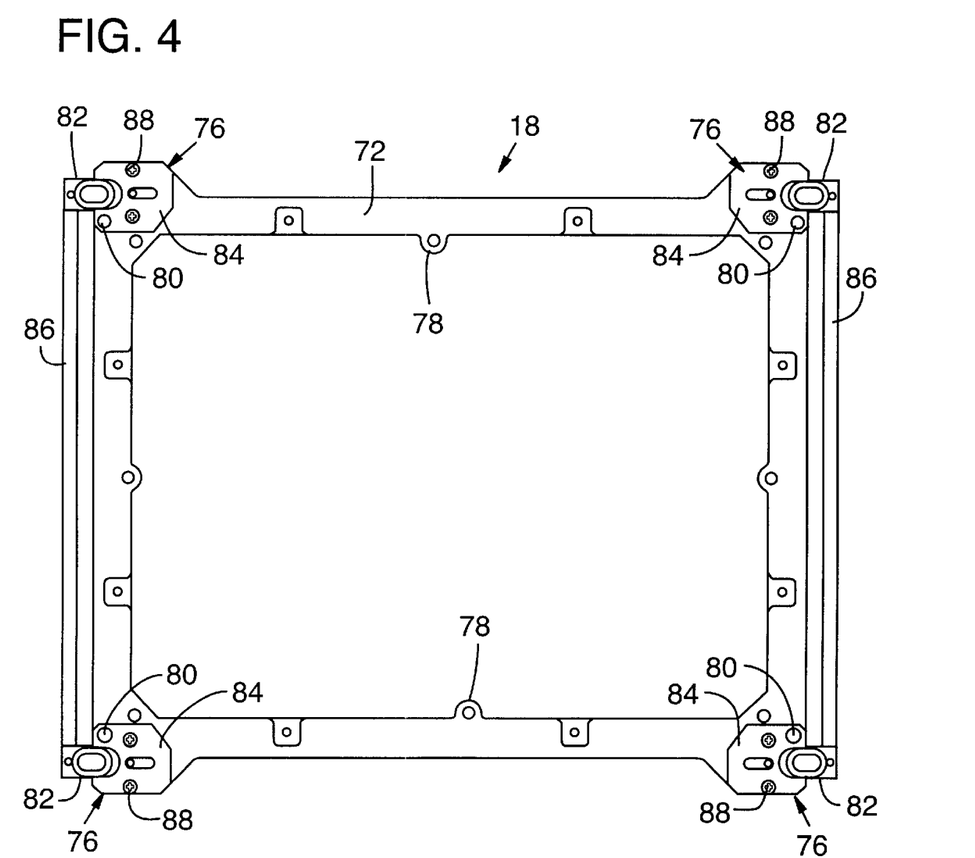
FIG. 4 is a bottom view of the plate of the fixture shown in FIG. 1.

As shown in FIGS. 1 and 3A, the fixture 10 further includes a detachable plate 18. As best shown in FIG. 3A, the detachable plate 18 includes a support structure 72 to which the hold downs 34 and upper portions 76 of the latch assemblies 26 are attached. The plate 18 fits to the frame 14 and is held in place by the latch assemblies 26, FIG. 1 (as discussed below). The support structure 72 provides an opening 74 that allows exposure of an upper surface 62 of a PCB 30 (FIGS. 1, 3A, and 3C). The shape and size of the frame 14 dictate the shape and outer dimensions of the support structure 72. The support structure 72 may further include tabs 78 for connection of hold downs 34 thereto (FIG. 4). The plate is preferably formed of aluminum or the composite material described above, but may be made of any sufficiently rigid material that has the ability to withstand temperatures in excess of 300° C. and is resistant to the chemicals typically used for the processing of PCBs, including resistance to lead adhesion. Additionally, the plate material is preferably relatively light in weight, is resistant to heat deterioration and wear, and does not act as a significant heat sink.

Referring to FIGS. 3A and 4, the plate 18 further preferably includes guideposts 80 to aid in guidance of the plate 18 onto the frame 14. Guideposts 80 are of dimensions sufficient to mate with guide holes 64 of the frame 14. Guideposts 80 and guide holes 64 may be placed anywhere on the plate 18 and frame 14, respectively, as long as the posts and holes do not interfere with the PCB processing. In the first embodiment, a guidepost 80 is placed adjacent each of upper portions 76 of the latch assemblies 26.

Referring to FIGS. 3A and 3C, a latch assembly 26 upper portion 76 is preferably located on each corner of the detachable plate 18, and mates with the respective latch assembly lower portion 70 on the frame 14. The latch assemblies 26 operate to secure the plate 18 to the frame 14 once a PCB 30 has been placed in the frame.

Figure 5:
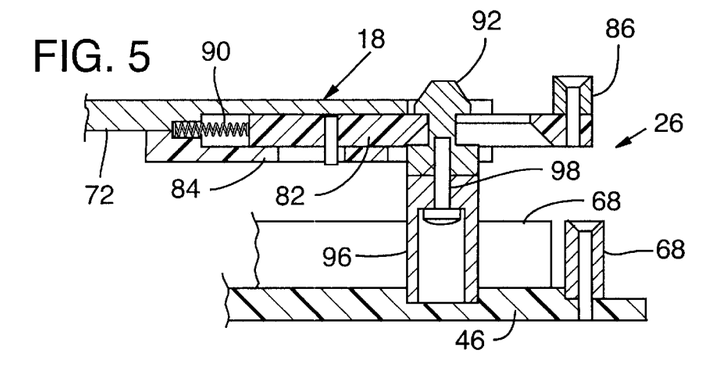
FIG. 5 is a partial cross-sectional view taken along line 5—5 of FIG. 2.
Figure 9:
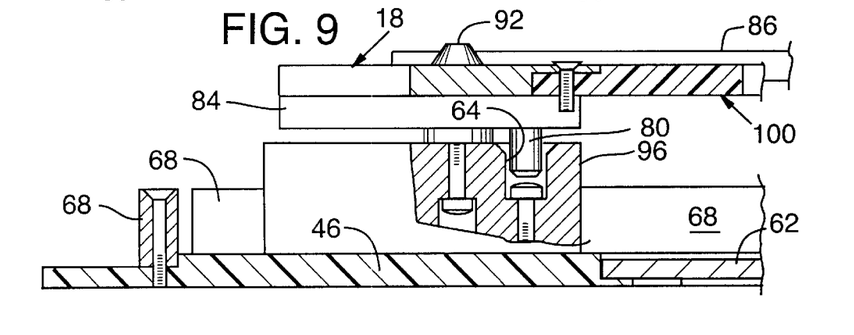
FIG. 9 is a partial cross sectional view taken along line 9—9 of FIG. 2.

The upper portion 76 of the latch assembly 26 includes catch 82 connected to the plate 18 via a bracket 84 (FIG. 3A). The catch 82 is an elongated aperture shaped and sized to mate with the latch assembly lower portion 70 (described below). The bracket 84 may be connected to the plate 18 by conventional means known to those skilled in the relevant art. As shown in FIG. 4, the present fixture embodiment illustrates connection of the bracket 84 to the plate 18 via screws 88. The plate 18 guide posts 80 may be attached to the bracket 84 as shown in FIG. 9. FIG. 9 is a cross-sectional view of an engaged fixture 10. As shown in FIG. 5, helical spring 90 urges the catch 82 in the bracket 84 to move in an outward direction.

Referring to FIGS. 1 and 3A, the upper portion 76 of the latch assembly 26 additionally includes an actuator 86. As shown in FIGS. 1, 3A, and 4, the actuator 86 may comprise a bar that extends the length of the plate 18 such that the actuator 86 simultaneously contacts (and may apply pressure to) more than one catch 82. The first embodiment of the fixture 10 includes four catches 82 located on each corner of the plate 18. Two actuators 86 are positioned on opposing sides of the plate 18, such that each actuator 86 may contact and simultaneously apply pressure to two of the catches 82. The actuators 86 are connected at each end to the catches 82 via conventional fastening means, such as, but not limited to, screws (FIG. 1).

Lower portion 70 of latch assembly 26 (best shown in FIGS. 3C and 5) includes a keeper 92 connected to frame 14 via a base 96. The keeper 92 preferably comprises a post having a radially flanged end. The flanged end is shaped and sized to allow the catch 82 of the latch assembly upper portion 76 to slide over the end of the keeper 92, and to engage a middle portion of the post such that the plate 18 is secured to the frame 14. The keeper 92 and base 96 may both be formed of a single piece. Alternatively, the keeper 92 may be connected to the base 96 by a variety methods, such as by use of a screw 98, as shown in the FIG. 5 embodiment. The keeper 92 and base 96 preferably are made of aluminum, a high-temperature thermoplastic: resin, or other similarly rigid and resistant material.

The fixture 10 is configured to operate such that all of the latch assemblies 26 simultaneously engage and thus no moment is created in the board 30. More specifically, referring to FIGS. 1, 3A, and 3C, a PCB 30 is placed within the frame 14 such that the PCB sets upon support shelf 54 (and/or support tabs 58 and/or other part of the frame 50). The plate 18 is then set on the frame 14 such that the catches 82 set on the top of the flanged ends of the keepers 92 and the guide posts 80 are aligned above the guide holes 64. An operator then presses on the plate 18 with slight downward directed pressure (preferably on opposing sides of the plate). Such downward pressure results in simultaneous engagement of all of the latch assemblies 26 of the fixture 10, thereby supporting and securing the PCB and its componentry in the fixture.

To remove the PCB 30 from the fixture 10, the plate 18 is lifted in an upward direction as the actuators 86 are pressed in a direction toward the PCB center (i.e., the actuators 86 are simultaneously pressed toward one another). Such pressure on the actuators 86 urges the spring-loaded catches 82 toward the center of the PCB 30, which align the catch apertures with the respective keepers 92 so that the plate 18 may be removed. The PCB 30 may then be removed from the frame 14 of the fixture 10. The access holes 66 may be used to retrieve the PCB from the frame 14 (FIG. 3C).

Alternative latch assemblies may be used to practice the present invention. For example, spring-loaded clips may be attached to the frame (or support wall 68) to connect directly to the outer edges of the plate 18. Two or more sp ring-loaded clips may be connected to one another and the frame (or support wall 68) and be actuated by a slider bar that, when pressed, urges the clips away from the plate to allow release of the plate from the frame 14. The important aspect of the latch assemblies is that the assemblies allow for simultaneous connection such that a moment is not created in the board as the plate 18 is connected to the frame 14. Further, the latch assemblies preferably allow connection and release of the plate 18 to the frame 14 with minimal operator manipulation.

Figure 2:
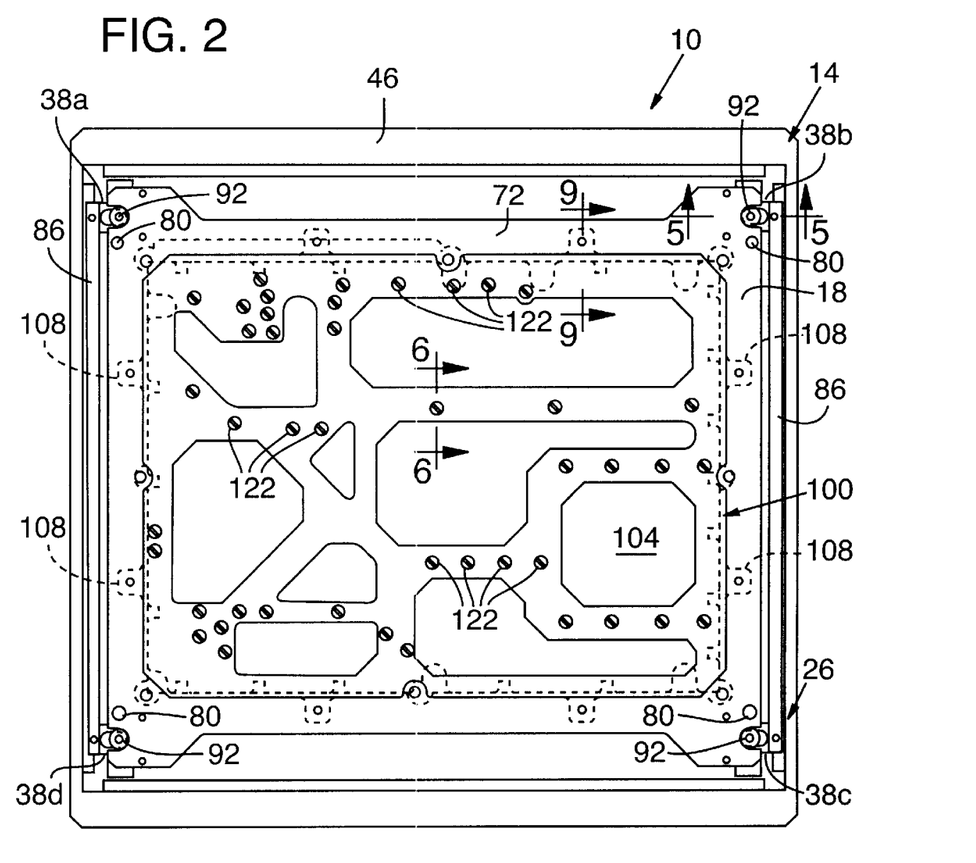
FIG. 2 is a plan view of a second fixture.

A second aspect of the fixture 10 is illustrated in FIG. 2. In addition to all of the features described above in relation to the first embodiment, the second embodiment further includes a removable insert 100 (FIGS. 2 and 3B). The removable insert 100 fits within the plate 18 and is connected thereto. The removable insert 100 preferably includes custom openings 104 and insert tabs 108. The openings 104 allow access to the upper surface 62 of the PCB 30 (FIGS. 2, 3B, and 3C). The locations and dimensions of the openings 104 shown in FIGS. 2 and 3B are arbitrarily drawn. The user's particular PCBs and the processes to be performed thereon dictate the openings 104 locations and dimensions. The insert tabs 108 provide for attachment of the removable insert 100 to the plate 18.

The removable insert 100 preferably comprises a sufficiently rigid material that is heat resistant up to temperatures above about 300° C., is resistant to chemicals used in the various PCB processes, and preferably does not act as a heat sink. For example, the removable insert 100 may comprise a composite material, e.g., FR-4 available from Electronic Insulation Supplies, Inc. of Atlanta, Ga. Accordingly, as the required number, positions, and dimensions of the openings 104 change due to a change in the user's PCBs and/or PCB processes, only the removable insert need be replaced. That is, the plate 18 may be used to support different inserts 100 having different openings 104.

The removable insert 100 additionally includes hold downs 34 connected to the lower surface 112 of the insert (FIG. 3B). Positioning the hold downs 34 on the lower surface 112 of the removable insert 100 avoids interference by the hold downs 34 during PCB processing, such as during wave soldering processes, while continuing to secure the PCB and/or particular components 110 on the PCB.

Figure 6:
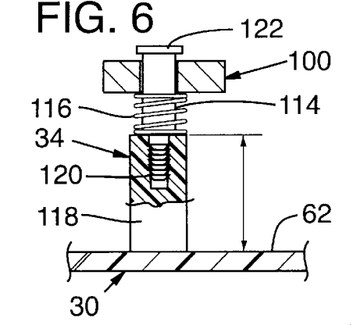
FIG. 6 is a cross-sectional view of a hold down taken along line 6—6 of FIG. 2, wherein the hold down contacts a surface of a printed circuit board.
Figure 7:
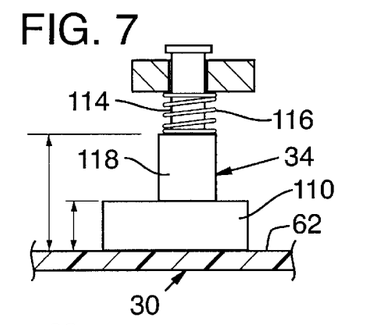
FIG. 7 is a side view of another hold down on a fixture, wherein the hold down contacts a component on a printed circuit board.

Hold downs 34 may be utilized for a variety of purposes. When the plate 18 is attached to the frame 14, the hold downs 34 may contact the upper surface 62 of the PCB 30 or may contact a preselected component (such as surface mount components, through-hole components, heat sinks, etc.) on the PCB (FIG. 3C). The hold downs may be used to, for example, apply pressure to a selected component on the board, secure a component in a particular position on the board, provide support for or align a component on the board, or locate a component during processing. As shown in FIG. 6, a hold down 34 may be used to contact the upper surface 62 of a PCB 30. As shown in FIG. 7, a hold down 34 may be used to contact a preselected component 110 mounted on the upper surface 62 of the PCB 30. The hold downs 34 provide a precise, preselected amount of inch pounds of pressure to the chosen portion of the PCB to ensure uniform application of pressure and thereby avoid creating a moment in the board.

Further, hold downs 34 may be utilized to hold a heat sink (not shown) in place on the PCB during a particular PCB process. Alternatively (or additionally), hold downs 34 may be used to cover desired areas on the PCB 30 during selected processes. Hold downs 34 also may be utilized to plug apertures in the PCB 30, such as plated holes, during selected PCB processes (e.g., wave soldering).

Referring to FIG. 6 (taken along line 6—6 of FIG. 2), a hold down 34 of the present invention preferably comprises a spacer 114 connected to a plunger base 118 by a fastener, such as a barbed pin 120. The spacer 114 is positioned between the plunger base 118 and insert 100. A compression spring 116 encircles the spacer 114 and urges the plunger base 118 in a downward direction, allowing application of preselected, precise inch pounds of force on the PCB 30 or component 110 by the hold down 34. Such precise, controlled force provides for accurate and consistent location tolerances. The hold down 34 is connected to the bottom surface 112 of the removable insert 100 by conventional means, such as by machine screws 122.

The hold down 34 may include a housing (not shown) to encapsulate the spring 116 and spacer 114. The housing reduces deterioration of the hold down 34 and reduces spring fatigue. The tip or distal end of the plunger base 118 may take a variety of forms depending upon the particular chosen function of the hold down 34. The plunger base is preferably made of a high-temperature thermoplastic resin.

Referring to FIG. 8, a fixture 210 includes a frame 214 and latch assemblies 226, both as described above in relation to fixture 10. Unlike fixture 10, however, fixture 210 includes an entirely detachable over arm bar 220 rather than a detachable plate. The latch assemblies 226, positioned on each end of the over arm bar 220, each include a spring-loaded catch 282 on the over arm bar 220 and respective keepers 292 attached to the frame 214. An actuator 286 is connected to each of the spring-loaded catches 282.

The fixture 210 may also include guide posts 280, preferably attached adjacent each catch 282. Fixture 210 may also include hold downs 234 connected to the over arm bar 220 via conventional means, such as screws 222. The hold downs 234 are the same as described above in relation to the second embodiment.

Fixture 210 operates in essentially the same manner as described above in relation to fixture 10. Specifically, fixture 210 operates to simultaneously engage both latch assemblies 226 such that uniform pressure is applied to the PCB 30 (i.e., no moment is created in the board). More specifically, referring to FIG. 8, a PCB 230 is placed within the frame 214 such that the PCB sets upon the frame, such as on a support shelf (not shown). Bar 220 is then set on the frame 214 such that the catches 282 set on the top of the flanged ends of the keepers 292 and the guide posts 280 are aligned above guide holes (not shown) defined in the frame 214. An operator then presses in a downward direction on the bar 220 (on the center of the bar or on opposing sides of the bar). Such downward pressure results in simultaneous engagement of both of the latch assemblies 226.

To remove the PCB 230 from the fixture 210, the bar 220 is lifted in an upward direction as the actuators 286 are pressed in a direction toward the PCB center (i.e., the actuators 286 are pressed toward one another). Such pressure on the actuators 286 urges the spring-loaded catches 282 toward the center of the PCB 230, and aligns the catch apertures with the keeper 292 so that the bar 220 may be removed. The PCB 230 may then be removed from the frame 214 of the fixture 210.

Whereas the invention has been described with reference to multiple embodiments, it will be understood that the invention is not limited to those embodiments. For example, the fixture of the present invention may include hold downs of a variety of shapes for different functions or may be used to support or secure a variety of substrates, including other substrates used in the semiconductor industry. That is, the fixture may support or secure any substrate requiring such without creation of a moment in the substrate and/or while allowing access to both surfaces of the substrate. The invention is intended to encompass all modifications, alternatives, and equivalents as may be included within the scope and spirit of the invention as defined by the following claims.

What is claimed is:

1. A fixture for supporting and securing a printed circuit board during processing, the fixture comprising:
   a frame for supporting the printed circuit board;
   a first opening defined by the frame, the first opening being of sufficient dimensions to expose a first surface of the printed circuit board received in the frame;
   a plate that is attachable to and completely detachable from the frame;
   at least two latch assemblies that are simultaneously operable to attach the plate to the frame such that the plate applies a uniform pressure to the printed circuit board received in the frame when the plate is attached to the frame; and
   a second opening defined by the plate, the second opening being of sufficient dimensions to expose a second surface of the printed circuit board.

2. The fixture of claim 1, wherein the pressure applied by the plate to the printed circuit board is applied in a direction substantially perpendicular to the second surface of the printed circuit board without creating a moment in the board.

3. The fixture of claim 1, further comprising a latch assembly that is actuated by application of pressure on the plate, the latch assembly thereby attaching the plate to the frame.

4. The fixture of claim 1, further comprising at least two latch assemblies that are simultaneously actuated by application of pressure on the plate, thereby attaching the plate to the frame without creating a moment in the printed circuit board.

5. The fixture of claim 1, further comprising a latch assembly located at each corner of the fixture, the latch assemblies being simultaneously actuated by application of pressure on the plate, thereby attaching the plate to the frame without creating a moment in the printed circuit board.

6. The fixture of claim 4, wherein each latch assembly comprises:
   an upper portion attached to the plate, the upper portion including a spring-loaded catch; and
   a lower portion attached to the frame, the lower portion including a keeper mateable with the catch.

7. The fixture of claim 6, wherein the fixture further comprises an actuator connected to at least two of the catches of the latch assemblies, the actuator operable to simultaneously urge the catches in a direction toward the plate.

8. The fixture of claim 6, wherein pressure applied to the actuator causes the actuator to simultaneously urge the catches in a direction toward the plate, thereby allowing simultaneous release of the keepers from the respective catches.

9. The fixture of claim 1, wherein the frame further comprises:
   a support shelf defined in the frame and extending about a portion of the first opening for supporting the printed circuit board in the frame.

10. The fixture of claim 9, wherein the support shelf contacts only the outermost edge of the printed circuit board.

11. The fixture of claim 10, wherein the support shelf maintains the second surface of the printed circuit board flush with an upper surface of the frame.

12. The fixture of claim 1, wherein the frame further comprises:
   support tabs connected to the frame and extending into the first opening for supporting an outermost edge of the printed circuit board.

13. The fixture of claim 12, wherein the support tabs maintain the second surface of the printed circuit board flush with an upper surface of the frame.

14. The fixture of claim 1, further comprising a removable insert attached to the plate, the inset having custom openings to expose pre-selected portions of the second surface of the printed circuit board.

15. The fixture of claim 1, further comprising a first hold down connected to the plate, the first hold down contacting the second surface of the printed circuit board whenever the plate is connected to the frame.

16. The fixture of claim 15, further comprising a second hold down connected to the plate, the second hold down contacting a component on the second surface of the printed circuit board whenever the plate is attached to the frame.

17. The fixture of claim 16, further comprising a hold down connected to a lower surface of the plate, the hold down securing a removable heat sink on the second surface of the printed circuit board when the plate is connected to the frame.

18. A fixture for supporting and securing a printed circuit board during processing, the fixture comprising:
   a frame for supporting the printed circuit board;
   a first opening defined by the frame, the first opening being of sufficient dimensions to expose a first surface of the printed circuit board received in the frame;
   a plate that is attachable to and completely detachable from the frame;
   a first latch assembly that is actuated by application of pressure on the plate, the actuated first latch assembly thereby attaching the plate to the frame such that the plate secures the printed circuit board received in the frame without creating a moment in the board; and
   wherein the first latch assembly comprises an upper portion attached to the plate, the upper portion including a spring-loaded catch and a lower portion attached to the frame, the lower portion including a keeper mateable with the catch.

19. The fixture of claim 18, further comprising a second latch assembly, the first and second latch assemblies simultaneously actuatable by application of pressure on the plate, the simultaneously actuated latch assemblies thereby attaching the plate to the frame without creating a moment in the printed circuit board.

20. The fixture of claim 18, further comprising a second opening defined by the plate, the second opening of sufficient dimensions to expose a second surface of the printed circuit board.

\* \* \* \* \*